May 31, 1960 M. E. HODGES 2,939,088

ELECTRONIC RELAY

Filed April 11, 1955

Inventor
Merwyn E. Hodges by J Wesley Haubner
His Attorney.

United States Patent Office 2,939,088
Patented May 31, 1960

2,939,088

ELECTRONIC RELAY

Merwyn E. Hodges, Philadelphia, Pa., assignor to General Electric Company, a corporation of New York Filed Apr. 11, 1955, Ser. No. 500,475

6 Claims. (Cl. 331—66)

This invention relates to an electronic relay, and more particularly to an extremely high-speed electronic control relay which is capable of reliable and accurate operation to perform preselected switching or level detecting functions.

In the art of high-speed protective relaying today, there is need for a reliable control relay which responds to an input voltage signal of at least a predetermined instantaneous value to produce substantially instantaneously an output voltage signal of predetermined constant characteristic. Such a relay, which operates in a manner similar to that of an electronic switch, will be referred to hereinafter as a "level detector." It is a general object of this invention to provide an extremely high-speed and versatile level detector which operates with a high degree of accuracy regardless of fluctuations in its supply voltage or variations in ambient temperature.

A level detector has many applications and may be used merely as a high-speed switch, to give on-off indications, or as a means for detecting a predetermined level of signal voltage. The level detector is particularly well suited for use in relay circuits where extremely fast operation, exceptional accuracy, or both are required. Typical examples of uses to which the level detector may be put are found in the following patents: 2,873,453, Merwyn E. Hodges and Norman A. Koss, issued on March 24, 1959; 2,873,454, Merwyn E. Hodges, Norman A. Koss and Harold T. Seeley, also issued on March 24, 1959; and 2,845,581, Hodges and Seeley, issued on July 29, 1958 (this patent having issued on application S.N. 602,886 filed on August 8, 1956, as a division of the present application).

A further object of the present invention is the provision of an electronic level detector utilizing an oscillator for obtaining extremely fast pickup and cutoff operation in response to selectable input voltage levels.

This invention has for another object the provision of an extremely high speed electronic switching device suitable for use in protective relaying circuits.

Still another object of this invention is to provide means responsive to an input signal of at least a predetermined instantaneous value for producing substantially instantaneously an output signal of predetermined constant characteristics.

It is another object to provide an electronic level detector which will respond consistently to a predetermined level of input signal regardless of supply voltage fluctuations or ambient temperature variations.

In carrying out my invention in one form, I provide an electronic level detecting means comprising oscillator and rectifying circuits arranged to obtain extremely fast response. The cathode circuit of the oscillator is biased by suitable non-linear impedance means to maintain a substantially constant level of response regardless of supply voltage fluctuations or ambient temperature variations.

Figure 1:
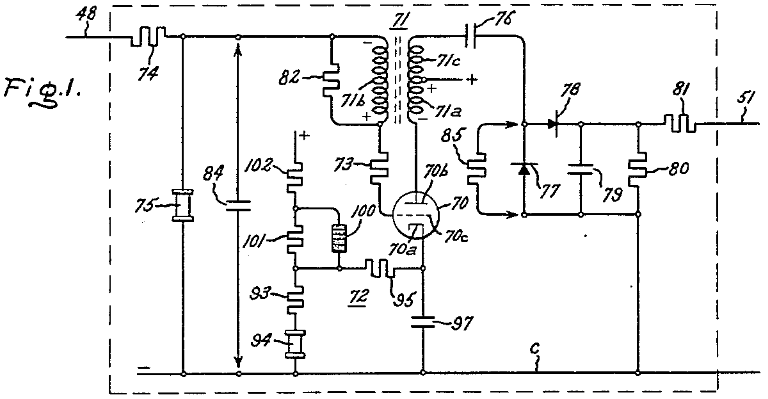
Figure 2:
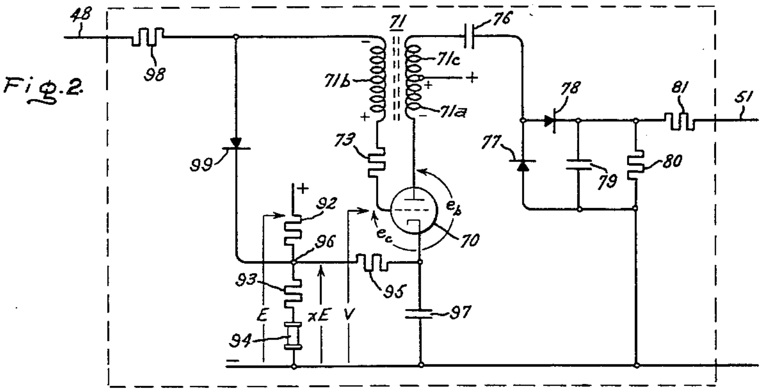
Figures 3, 4:
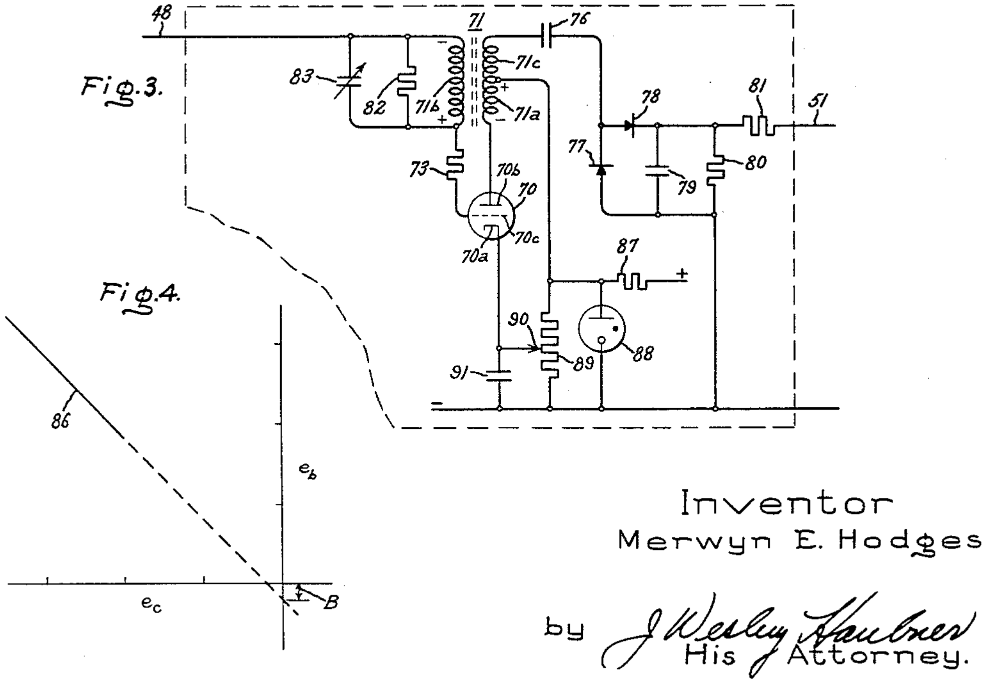

My invention will be better understood and further objects and advantages will be apparent from the following description taken in conjunction with the accompanying drawing, in which Figs. 1, 2 and 3 are schematic diagrams illustrating various embodiments of my invention; and Fig. 4 is a graphical representation of a certain characteristic of a vacuum tube of the type used in the circuits of Figs. 1, 2 and 3.

Referring now to Fig. 1 of the drawing, I have shown by way of illustration a level detector comprising an oscillator which includes an electric valve or triode vacuum tube 70 having a cathode **70*a*, a plate or anode 70*b*, and a control grid 70*c*. The cathode heater and heater circuits, being well known to those skilled in the are, have been omitted for the sake of drawing simplicity. Plate 70*b* is connected to a positive bus through a portion 71*a* of a tapped winding of a powdered iron core coupling transformer 71. (The bold symbols + and — are used throughout the drawing to represent the positive bus and negative bus respectively of a unidirectional supply voltage source, such as a battery, which has not been shown.) A secondary winding 71*b* of transformer 71 comprises a positive feedback circuit which is coupled to control grid 70*c*. The relative instantaneous polarities of transformer windings 71*a* and 71*b* are indicated in Fig. 1 by small symbols + and —. Voltage induced induced in the secondary or feedback winding 71*b* as a result of changing tube current in winding 71*a* affects the voltage level of control grid 70*c* in the conventional manner to cause oscillation in the circuit of tube 70**.

To start oscillation, as is well known to those skilled in the art, the control grid voltage of tube 70 must become more positive than a predetermnied negative starting value with respect to cathode **70*a*. This predetermined starting value is dependent upon at least the particular tube characteristics and the magnitude of cathode to plate voltage. By providing a suitable cathode bias circuit 72, which will be described in detail below, the potential of cathode 70*a* is raised to a positive magnitude above negative bus potential. Therefore, oscillation can now be started by energizing control grid 70*c*** with a unidirectional signal voltage of at least a predetermined instantaneous magnitude having positive polarity with respect to negative bus. This predetermined positive magnitude will be referred to as the pickup value of signal voltage.

A suitable source of unidirectional electric energy, represented in the drawing by a conductor 48, supplies the signal voltage to which the level detector responds. The magnitude of signal voltage may be subject to controlled variations, i.e., the potential of conductor 48 may vary with respect to the negative bus. As shown in Fig. 1, conductor 48 is connected to the input circuit of the level detector. The input circuit comprises a voltage limiting arrangement, the feedback circuit, and a grid resistor 73 which is connected to control grid **70*c*. Grid resistor 73 limits grid-to-cathode current flow whenever the potential of grid 70*c* is positive with respect to cathode 70*a*. The voltage limiting arrangement, which includes, for example, a resistor 74 and a limiter 75 as shown in Fig. 1, is provided to prevent the average voltage of grid 70*c* from exceeding a maximum permissable level for correct oscillator operation regardless of signal voltage magnitude. Limiter 75 is a non-linear impedance element, that is, it has a non-linear current-voltage characteristic. As the voltage applied across the limiter is increased, its ohmic value decreases so that current will increase at a greater rate than voltage. Many such non-linear current-voltage characteristic elements are known in the art, and for the purposes of the illustrated embodiment of my invention I prefer at present to use a special ceramic resistance material comprising silicon carbide crystals held together by a suitable binder, such as described and claimed in U.S. Patent No. 1,822,742 issued to Karl B. McEachron on September 8, 1931. As the signal voltage raises to excessively large magnitudes, the resistance of limiter 75 decreases and a non-linearly increasing voltage drop is produced across resistor 74 thereby limiting the voltage available at grid 70c. Another method for limiting the voltage level at grid 70c** is illustrated in Fig. 2 and will be explained below. It should be apparent that where the maximum level of signal voltage is adequately limited by the source supplying it the voltage limiting arrangement can be omitted from the level detector, as shown in Fig. 3.

As soon as the signal voltage reaches the predetermined pickup value required to raise the control grid voltage to its predetermined starting value, oscillation begins. The primary and secondary windings of the coupling transformer 71 are provided with a suitable turns ratio to induce in secondary winding 71b a feedback voltage many times larger than required for oscillation. As a result, the grid is overdriven and the plate current of tube 70 quickly builds up to full amplitude. The feedback circuit has a high $L/C$ ratio, since substantially the only capacitance present is that of the coupling transformer windings as reflected in the feedback winding 71b. More specifically, the capacitance which, in combination with the inductance of the feedback circuit, sustains continuous oscillations of the oscillator is provided in the preferred embodiment of my invention substantially solely by the distributed capacitance of the coupling transformer windings, and this capacitance is very small relative to the circuit inductance. Consequently, the feedback circuit has a low Q, i.e., a low ratio of stored energy to the energy dissipated during a cycle; and a correspondingly short time is required for the oscillation amplitude to reach maximum magnitude. Alternating voltage output is developed across a portion 71c of the tapped winding of transformer 71 in response to oscillations. This voltage oscillates at a high frequency, such as 12,000 cycles per second, and has a non-sinusoidal waveform. With the arrangement just described, maximum amplitude of the alternating voltage output is reached during approximately the initial cycle of oscillation.

The tapped winding of coupling transformer 71 is in effect an auto-transformer comprising a primary winding 71a and a secondary winding 71c having their common terminal connected to positive bus. The turns ratio between windings 71a and 71c is selected to produce an amplified alternating voltage across secondary winding 71c. Amplified alternating voltage is desirable for reasons that will become clear below.

The alternating voltage from secondary winding 71c is supplied to a voltage doubler rectifier circuit which produces a unidirectional output voltage of substantially twice the peak value of the amplified alternating voltage. As shown in Fig. 1, the voltage doubler circuit includes a coupling capacitor 76, a shunt rectifier 77 connected between capacitor 76 and negative bus, and a blocking rectifier 78 connected in series circuit relationship with a filter capacitor 79 across shunt rectifier 77. A unidirectional voltage substantially equal to the peak-to-peak value of the alternating voltage is developed by this circuit across a resistor 80 connected from negative bus to the common point between blocking rectifier 78 and filter capacitor 79. During a negative half cycle of the alternating voltage, with respect to positive bus, shunt rectifier 77 conducts current which charges capacitor 76 by an amount substantially equal to the peak value of the half cycle of voltage. During the succeeding positive half cycle, blocking rectifier 78 conducts current and filter capacitor 79 is charged to a voltage level determined by the charge accumulated on capacitor 76 during the preceding negative half cycle plus the peak value of the positive half cycle of voltage. Thus, filter capacitor 79 is charged to a voltage level substantially equal to twice the peak value of alternating voltage within approximately the initial two cycles of oscillations. This large unidirectional voltage is applied across resistor 80, blocking rectifier 78 preventing the discharge of filter capacitor 79 back into coupling capacitor 76 during succeeding negative half cycles.

The polarity of the large unidirectional voltage developed across resistor 80 by the illustrated voltage doubler circuit is positive with respect to negative bus. It should be recognized that a negative voltage could be developed by reversing the forward current direction of both rectifiers 77 and 78. The voltage doubler circuit will then function as described above except that coupling capacitor 76 accumulates charge during positive half cycles of alternating voltage and filter capacitor 79 charges during negative half cycles. The resulting unidirectional voltage across resistor 80 will be negative with respect to negative bus.

The voltage between a lead 51 and negative bus comprises the output voltage of the level detector. As can be seen in Fig. 1, lead 51 is coupled to the positive terminal of resistor 80 through a current limiting resistor 81. The output voltage is supplied to any load circuit, not shown, connected between lead 51 and negative bus. A typical load circuit might comprise, for example, the grid circuit of a cathode follower vacuum tube which operates upon attaining full conduction to produce essentially constant control voltage across a relatively low-impedance cathode resistor (not shown). Full conduction can be attained in response to level detector output voltage of at least a predetermined value, which value is less than the maximum magnitude of the large unidirectional voltage produced by the level detector. Advantages of this type of load circuit are that the predetermined value of voltage is reached before it is necessary for the output voltage of the level detector to build up to its maximum magnitude, and ripple voltage in the level detector output is not reflected in the ultimate control voltage. When the level detector supplies the grid circuit of a cathode follower tube, resistor 80, as shown in Fig. 1, establishes a grid current return path from the control grid to cathode, and resistor 81 limits grid current whenever the grid is positive with respect to cathode.

The output voltage of the level detector can be produced with respect to a reference potential other than that of negative bus. For example, if it is desired to add the level detector output voltage to another unidirectional voltage, the output circuit of the level detector should be disconnected from negative bus by open-circuiting the conductor labeled "C" in Fig. 1, and suitable series circuit connections can be made between the other voltage source, not shown, and the level detector output circuit. To insure effective output from the level detector, it is necessary that the other voltage source have a relatively negligible impedance to negative bus at the oscillator frequency.

In certain level detector applications it is desirable to establish within predetermined limits the magnitude of signal voltage below which the level detector will cut off, i.e., stop oscillation. There are several ways to affect the cutoff point of the level detector. For example, resistance connected in series circuit with cathode 70a will cause the cathode potential to increase with respect to negative bus in response to average tube current flow during oscillations and will thereby influence the level of unidirectional control grid voltage at which oscillations will stop. Further reference to this method for influencing the cutoff point of the level detector will be made below.

Another method for affecting the cutoff point is by regulating the amount of energy stored in the feedback circuit. Oscillations will stop whenever the energy stored in the feedback circuit becomes insufficient both to supply the circuit losses during the negative half cycle of control grid voltage and to return the grid voltage to an instantaneous magnitude above its starting value. To regulate the energy stored in the feedback circuit, a loading resistor 82 is connected across secondary winding 71b, as shown in Fig. 1. The cutoff magnitude of signal voltage will be raised by reducing the amount of resistance. A loading resistor is selected having proper resistance to establish the cutoff point within the desired limits. Fig. 3 illustrates a modification of this method for determining the cutoff point whereby a substantially fixed predetermined cutoff magnitude of signal voltage can be obtained. A variable capacitor 83 is connected in parallel circuit relationship with resistor 82 to affect the energy storage capacity of the feedback circuit. Capacitor 83 provides a convenient adjustable means for obtaining the desired cutoff point of the level detector. Where the cutoff point is not critical, resistor 82 and capacitor 83 may be omitted, as shown in Fig. 2.

The A.-C. impedance of the source of signal voltage supplied to the level detector will affect the cutoff magnitude of the signal voltage. If this impedance is subject to change due to adjustable elements in the preceding circuits, undesirable variations in the cutoff magnitude of signal voltage will result. To remedy this situation, a shunting capacitor 84 may be connected in the input circuit of the level detector, as shown in Fig. 1, thereby providing a constant A.-C. impedance between the feedback circuit and negative bus.

In certain level detector applications it may be highly desirable to have the output voltage decay extremely rapidly upon the signal voltage going below its cutoff magnitude. Such an application exists, for example, where it is desired to produce output voltage impulses of substantially rectangular waveform. The time required for the coupling capacitor 76 in the voltage doubler circuit to discharge largely influences the decay time of the output voltage, and this time can be reduced by connecting a resistor 85 of suitable resistance across shunt rectifier 77, as is shown in Fig. 1. Since the maximum magnitude of the output voltage is greater than the value of voltage at which a typical load circuit responds, the resulting reduction in maximum output voltage magnitude does not adversely affect operation of the level detector.

The cathode bias circuit of the level detector will now be considered. As stated above, oscillation in the circuit of tube 70 will begin whenever the control grid voltage of tube 70 becomes more positive than a predetermined negative starting value with respect to cathode 70a. This starting value of grid voltage is dependent upon the cathode to plate voltage of tube 70. The cathode to plate voltage is dependent in turn on the magnitude and stability of the supply voltage connected to the positive and negative buses. The supply voltage may be subject to fluctuations, e.g., the potential provided from a commonly used 129 volt supply battery in a typical application can vary between the limits of 100 to 140 volts. Variations of this magnitude will materially affect the oscillation starting point and thereby cause inconsistent and inaccurate operation of the level detector. It is an object of the cathode bias circuit, therefore, to render tube 70 responsive to a constant pickup value of signal voltage regardless of supply voltage fluctuations. To understand the manner in which the bias circuit operates, the relationship between the starting value of grid voltage and the magnitude of plate voltage should first be examined.

It has been found that at the instant oscillation starts, the relationship between the instantaneous grid-to-cathode voltage $e_c$ and the instantaneous plate-to-cathode voltage $e_b$ is substantially linear. Line 86 in Fig. 4 is a graphical representation of this relationship, and the equation for line 86 can be written as follows:

$$e_b = B - \mu e_c \quad (1)$$

wherein B is a constant quantity which may be positive, zero, or negative, and $\mu$ is a positive quantity representing the amplification factor of the vacuum tube. The values of $\mu$ and B are determined by the characteristics of the particular triode vacuum tube used and by the coefficient of coupling in the feedback circuit of the oscillator.

Reference should now be made to Fig. 2 wherein certain voltages in the level detector circuits have been designated by reference letters. As shown in Fig. 2, the reference letter E is defined as the supply voltage which is subject to fluctuations, $x$ is an unknown ratio, $xE$ represents the cathode bias voltage, i.e., that portion of supply voltage with respect to negative bus which is supplied to cathode 70a at the start of oscillation, and V is the pickup value of signal voltage applied to control grid 70c. Voltage V will be assumed to be constant at the instant oscillation starts. From the above definitions, the following two equations are true immediately prior to the start of oscillation:

$$e_c = V - xE \quad (2)$$

$$e_b = E - xE \quad (3)$$

Substituting Equations 2 and 3 into Equation 1 gives $$E - xE = B - \mu V + \mu xE \quad (4)$$

and rearranging, $$(\mu + 1)xE = E + \mu V - B \quad (5)$$

Let $$\frac{1}{\mu + 1} = K_1 \quad (6)$$

and $$\mu V - B = K_2 \quad (7)$$

wherein both $K_1$ and $K_2$ are constants. By substitution, Equation 5 reduces to $$xE = K_1(E + K_2) \quad (8)$$

and $$x = K_1 + \frac{K_1 K_2}{E} \quad (9)$$

Equation 9 demonstrates that if the assumption of a constant pickup value V of signal voltage is to be valid, regardless of fluctuations of supply voltage E, the ratio $x$ must increase or decrease respectively, as the supply voltage decreases or increases. It can also be seen from the above analysis that if V is equal to $B/\mu$, $K_2$ will be zero and $x$ will equal $K_1$, a constant. Thus, a cathode bias voltage which is related to the supply voltage by a predetermined fixed percentage of approximately $$100/(\mu + 1)$$

enables the level detector to respond consistently to a particular constant pickup value of signal voltage regardless of supply voltage fluctuations. This particular pickup value is substantially equal to $B/\mu$ and will be referred to hereinafter as the predetermined inherently constant value of signal voltage. A circuit arrangement including linear resistance elements to obtain a cathode bias voltage of the aforesaid fixed percentage is described and claimed in Patent 2,802,945 issued to Harold T. Seeley on August 13, 1957. As demonstrated in that patent, wherein the fixed percentage and the predetermined inherently constant value of signal voltage are derived graphically for an oscillator using a pentode vacuum tube, the predetermined inherently constant value of signal voltage is very small. For a typical oscillator arrangement employing a triode vacuum tube, the predetermined inherently constant value of signal voltage is similarly very small and may be slightly negative.

For the purposes of my invention it is desirable that the level detector operate in response to a constant pickup value of signal voltage which value, in some level detector applications, may be relatively large and of positive polarity. In many relay applications it is undesirable to employ negative control grid bias voltage, since a source of negative bias voltage, such as a battery, decreases the reliability and increases the maintenance problems of the relaying system. Therefore, I prefer not to utilize the fixed percentage cathode bias and its accompanying predetermined inherently constant value of signal voltage to obtain the consistent operation desired.

To insure that the level detector will respond to a selectable constant pickup value of signal voltage, I provide in one embodiment of my invention, illustrated in Fig. 3, a voltage regulating circuit to maintain a substantially constant plate-to-cathode voltage for tube 70. The cathode bias voltage is obtained from the regulated voltage, and since the plate voltage is held constant, a constant pickup value of signal voltage is necessarily maintained. The voltage regulating circuit, as shown in Fig. 3 by way of example, comprises a resistor 87 in series circuit relationship with a cold cathode voltage regulating OA3/VR75 gas tube 88 connected between positive and negative buses. A tapped resistor 89 is connected across tube 88, and, due to the regulating action of tube 88, a regulated voltage which will not reflect changes in supply voltage is maintained across resistor 89. The plate 70b of tube 70 is connected through transformer winding 71a to the positive terminal of resistor 89. Cathode 70a of tube 70 is connected by a slider 90 to the tapped resistor 89. Cathode 70a is thereby supplied with positive bias voltage comprising a selectable portion of the regulated voltage. The position of slider 90 is selected to provide the necessary cathode bias to prevent oscillation until a signal voltage of desired pickup value is reached. A capacitor 91 is connected between cathode 70a and negative bus to provide a shunt path of negligible impedance to alternating current. With this cathode bias arrangement, the level detector can be made to operate consistently in response to any selected pickup value of signal voltage within relatively broad limits.

By using a non-linear resistance element in the cathode bias circuit, I am able to maintain a constant pickup value of signal voltage without resorting to a voltage regulating circuit. Fig. 2 illustrates such a cathode bias circuit. The portion $xE$ of supply voltage E applied to cathode 70a can be made to vary in such non-proportional relationship to supply voltage that the requirement for constant pickup voltage V as defined by Equation 8 above is fulfilled. A voltage dividing network is connected between positive and negative buses and comprises a resistor 92, a resistor 93 and a non-linear resistance element 94, as shown in Fig. 2. Cathode 70 of tube 70 is connected through a resistor 95 to the common point 96 between resistors 92 and 93. The voltage between point 96 and negative bus is the cathode bias voltage. Element 94 may comprise any suitable non-linear resistor, such as, for example, the non-linear current-voltage characteristic element 75 described above. The characteristic of element 94 is such that its resistance decreases with increasing voltage applied across it. Thus, as the supply voltage increases, the ratio of cathode bias voltage to supply voltage will decrease. A conventional resistor 93 is connected in series circuit relationship with element 94, and the particular resistance values of this combination are selected to give the necessary degree of non-linearity between ratio $x$ and supply voltage E as established by Equation 9 above. With this non-linear cathode bias arrangement, by selecting suitable linear and non-linear resistance values for the various components of the voltage dividing network, the level detector can be made to operate substantially consistently, regardless of supply voltage fluctuations, in response to any selected pickup value of signal voltage.

A capacitor 97 is connected from cathode 70a to negative bus, as shown in Fig. 2. This capacitor together with resistor 95 establish the potential of cathode 70a at an average positive level with respect to cathode bias voltage point 96 in response to average tube current flow during oscillations. In this manner the cutoff magnitude of signal voltage can be raised, since the level of unidirectional control grid voltage at which oscillation stops is dependent upon the cathode potential. The amount of resistance of resistor 95 will influence the average cathode potential, and a suitable resistor is selected to establish the desired cutoff point of the level detector.

Fig. 2 also illustrates an alternative method for limiting to a maximum permissible level the voltage at grid 70c of tube 70. This voltage limiter, which can be used in place of resistor 74 and limiter 75 described above, comprises a resistor 98 and a rectifier 99. Rectifier 99 is connected from the input circuit of the level detector to point 96 of the voltage dividing network. The rectifier is arranged to prevent the voltage level in the input circuit from exceeding the magnitude of voltage between point 96 and negative bus. If a signal voltage greater than this magnitude is supplied to the level detector, the excessive voltage will appear across resistor 98, and only a voltage equal to the cathode bias voltage will be available at grid 70c.

The embodiment of the level detector shown in Fig. 1 illustrates a cathode bias circuit 72 designed to maintain a constant pickup value of signal voltage regardless of supply voltage fluctuations or ambient temperature variations. In the cathode bias circuit of Fig. 2, described above, the resistances of the components of the voltage dividing network tend to change in response to temperature changes. Since the non-linear resistance element 94 may have a temperature characteristic different than that of the conventional resistors 92 and 93, and in fact may have a negative temperature coefficient, variations in ambient temperature can cause the cathode bias voltage $xE$ to deviate from its predetermined non-proportional relationship with respect to supply voltage E defined by Equation 8 above. To obtain the optimum degree of consistent operation by the level detector, therefore, I have added a negative temperature coefficient resistance element 100 to the cathode bias circuit, as shown in Fig. 1. This negative temperature coefficient element may be of any suitable type, such as a semi-conductor in which resistance varies inversely as its temperature changes. A conventional resistor 101 is connected across element 100, and this parallel circuit is connected in series circuit relationship with another resistor 102. The combination of element 100 and resistors 101 and 102 is connected in the cathode bias voltage dividing network in place of the resistor 92 shown in Fig. 2. The particular resistance values of this combination are selected to give the degree of non-linear resistance change, with respect to temperature, required to compensate for the corresponding non-linear resistance change of the combination resistor 93 and non-linear resistance element 94. With this arrangement, the cathode bias voltage can be made to meet satisfactorily the terms of Equation 8 above, and thus insure a constant pickup value of signal voltage, regardless of ambient temperature variations.

From the foregoing description of the level detector, its mode of operation should now be readily understandable. The level detector is energized by a unidirectional signal voltage applied between conductor 48 and negative bus. It may be desired, depending upon the particular application, that the level detector operate only in response to a signal voltage greater than a predetermined positive pickup level, or that the level detector operate whenever the signal voltage exceeds zero volts with respect to negative bus, or that the level detector operate as long as the signal voltage is more positive than a predetermined negative value. The nature of the source supplying the signal voltage may be such that the signal voltage is increasing slowly as it passes through its predetermined pickup level, or such that the signal voltage rises substantially instantaneously from zero to its maximum magnitude. The operation of the level detector to produce an output voltage is the same under any combination of the foregoing conditions.

The components of the cathode bias circuit of the level detector are selected, as described above, so that proper bias voltage is applied to cathode 70*a* to establish a constant pickup value of signal voltage which corresponds to the desired pickup level. As soon as the instantaneous magnitude of signal voltage reaches this pickup level, the voltage at control grid 70*c* with respect to cathode reaches its starting value, the circuit of tube 70 begins to oscillate, and an alternating voltage is produced across transformer secondary winding 71*c*. The choice of a cathode bias circuit, different embodiments of which are illustrated in Figs. 1, 2 and 3, depends upon the degree of accuracy demanded in the particular level detector application. It is possible, as described above, to maintain a substantially constant pick-up value of signal voltage regardless of supply voltage fluctuations or ambient temperature variations. The signal voltage is limited to a maximum permissible level either by the voltage source itself or by the input circuit of the level detector, as described above.

The alternating voltage from secondary winding 71*c* is rectified by the voltage doubler circuit, and a relatively large unidirectional output voltage is developed between lead 51 and negative bus. The magnitude of this output voltage is substantially unaffected by the waveform or magnitude of signal voltage, as long as the signal voltage is greater than its cutoff value. A typical load circuit supplied by the level detector, such as the cathode follower vacuum tube referred to above, responds before the full magnitude of output voltage is developed. The overall operating time required by my level detector to develop an output voltage of substantially maximum magnitude in response to the pickup value of signal voltage has been found to be less than .0002 second.

The level detector stops operating and the output voltage rapidly decays whenever the signal voltage is reduced below a predetermined cutoff value. As described above, the cutoff value of signal voltage is affected by the resistance 95 in the cathode circuit of tube 70 and by the resistance 82 and/or capacitance 83 in the feedback circuit of the oscillator. It is possible to establish a cutoff value of signal voltage equal to or greater than the pickup value, with a resultant condition of intermittent output while the signal voltage remains between its pickup and cutoff values.

While I have shown and described a preferred form of my invention by way of illustration, many modifications will occur to those skilled in the art. I, therefore, contemplate in the appended claims to cover all such modifications as fall within the true spirit and scope of my invention.

What I claim as new and desire to secure by Letters Patent of the United States is:

1. In combination, an electric valve having a cathode, an anode and a control grid, means for coupling said anode and said control grid together to form an oscillator, a pair of supply voltage terminals, said supply voltage being subject to fluctuations, means connecting said anode to one of said terminals, means for applying between said control grid and the other of said terminals a signal voltage which upon becoming more positive than a selected pickup value is operable to initiate oscillations, and impedance means having a non-linear current-voltage characteristic connected between said terminals and coupled to said cathode for maintaining said cathode at a voltage which varies in a predetermined non-proportional relationship with respect to changing supply voltage thereby to maintain said pickup value essentially constant during fluctuations of said supply voltage.

2. In combination, an electric valve having a cathode, an anode and a control grid, means for coupling said anode and said control grid together to form an oscillator, a pair of supply voltage terminals, said supply voltage being subject to fluctuations, means connecting said anode to one of said terminals, means for applying between said control grid and the other of said terminals a signal voltage which upon exceeding a predetermined pickup value is operable to initiate oscillations, a voltage divider connected between said terminals and comprising a linear resistance portion and a non-linear resistance portion, and means connecting said voltage divider to said cathode to supply cathode bias voltage of sufficient magnitude to establish said predetermined pickup value of signal voltage, said linear and non-linear portions of said voltage divider being selected to cause predetermined non-proportional variation in the cathode bias voltage in response to supply voltage fluctuation to maintain said predetermined pickup value of signal voltage essentially constant in spite of said supply voltage fluctuations.

3. In combination, an electric valve having a cathode, an anode and a control grid, means for coupling said anode and said control grid together to form an oscillator, a pair of supply voltage terminals, said supply voltage being subject to fluctuations, means connecting said anode to one of said terminals, means for supplying between said control grid and the other of said terminals a signal voltage which upon exceeding a predetermined pickup value in the positive direction is operable to initiate oscillations, a first non-linear impedance element in which resistance varies inversely with respect to changes of its voltage and in which resistance varies in a non-linear relation to ambient temperature changes, a second non-linear impedance element in which resistance varies in a non-linear relation to ambient temperature changes, a voltage divider connected across said terminals and comprising said first and said second elements, means connecting said voltage divider to said cathode to supply cathode bias voltage of proper magnitude to establish said predetermined pickup value of signal voltage, said first and second elements being selected to vary the cathode bias voltage in predetermined non-proportional relation to changes of said supply voltage regardless of ambient temperature variations thereby maintaining an essentially constant predetermined pickup value of signal voltage.

4. In an electronic device for consistently detecting a predetermined level of variable unidirectional input voltage, positive and negative unidirectional supply voltage terminals, a voltage dividing network connected between said terminals and including at least one impedance element haing a non-linear current-voltage characteristic for providing a bias voltage having a predetermined non-proportional relationship to said supply voltage, an electric valve having an anode coupled to said positive terminal, a cathode supplied by said bias voltage, and a control grid, a feedback circuit coupling said anode to said control grid to form an oscillator, means applying said input voltage between said control grid and said negative terminal, said bias voltage being selected to prevent the starting of oscillations until said input voltage exceeds said predetermined level, said predetermined non-proportional relationship being selected to maintain said predetermined level essentially constant regardless of fluctuations of said supply voltage, and means connected to said anode to produce an output control voltage in response to oscillations.

5. In an electronic device for detecting a predetermined level of variable unidirectional input voltage, positive and negative unidirectional supply voltage terminals, an electric valve having an anode coupled to said positive terminal, a cathode supplied by a selectable portion of said supply voltage, and a control grid, a feedback circuit coupling said anode to said control grid to form an oscillator and including transforming means to supply said control grid with voltage having substantially greater amplitude than the amplitude required for oscillation, said transforming means having sufficient distributed capacitance to sustain continuous oscillations and said feedback circuit having a relatively high ratio of inductance to capacitance, means applying said input voltage between said control grid and said negative terminal, the cathode voltage of said electric valve being selected to prevent the starting of oscillations as long as said input voltage is more negative than said predetermined level, whereby said electric valve will be in an oscillatory condition whenever said input voltage is more positive than said predetermined level, step-up transforming means connected to said anode to produce amplified alternating voltage in response to oscillations, and a rectifier and filter circuit supplied by said alternating voltage to produce a relatively smooth unidirectional output control voltage, whereby said output control voltage is produced within an extremely short time in response to at least said predetermined level of input voltage.

6. In an electronic device for detecting a predetermined level of a variable input voltage, a pair of supply voltage terminals for supplying a unidirectional voltage subject to fluctuations, an electric valve having an anode coupled to one of said terminals, a cathode and a control grid, a feedback circuit coupling said anode to said control grid to form an oscillator and including transformer means to supply said control grid with voltage having substantially greater amplitude than the amplitude required for oscillation, said transforming means having sufficient distributed capacitance to sustain continuous oscillations and said feedback circuit having a relatively high ratio of inductance to capacitance, means applying the input voltage between said control grid and the other terminal, non-linear impedance means connected between said terminals and coupled to said cathode to supply said cathode with a portion of said supply voltage selected to permit the starting of oscillations only when said input voltage becomes more positive than said predetermined level, said non-linear impedance means being arranged to vary said selected portion in a predetermined non-proportional relationship with respect to changing supply voltage thereby to maintain said predetermined level essentially constant during fluctuations of said supply voltage, step-up transforming means connected to said anode to produce amplified alternating voltage in response to oscillations, and a rectifier circuit supplied by said alternating voltage to produce a unidirectional output control voltage, whereby said output control voltage is consistently produced within an extremly short time in response to at least said predetermined level of input voltage.

References Cited in the file of this patent

UNITED STATES PATENTS

| | | |
|---|---|---|
| 1,695,885 | Crichton | Dec. 18, 1928 |
| 2,111,228 | Basim | Mar. 15, 1938 |
| 2,230,216 | Boers | Jan. 28, 1941 |
| 2,432,227 | Dailey et al. | Dec. 9, 1947 |
| 2,544,519 | Wood | Mar. 6, 1951 |
| 2,562,228 | Atwood | July 31, 1951 |
| 2,596,590 | Overton | May 13, 1952 |
| 2,600,270 | Saunders | June 10, 1952 |
| 2,606,176 | Frommer | Aug. 5, 1952 |
| 2,623,176 | Witsenburg | Dec. 23, 1952 |
| 2,669,677 | Entwisle | Feb. 16, 1954 |
| 2,695,977 | Hupert | Nov. 30, 1954 |
| 2,787,707 | Cockburn | Apr. 2, 1957 |
| 2,798,155 | Valeton | July 2, 1957 |
| 2,802,945 | Seeley | Aug. 13, 1957 |